US008030107B2

(12) United States Patent
Chung et al.

(10) Patent No.: US 8,030,107 B2

(45) Date of Patent: Oct. 4, 2011

(54) ELECTRO-LUMINESCENT DEVICE AND METHOD FOR MANUFACTURING THE SAME

(75) Inventors: In Jae Chung, Kyeongki-do (KR); Gee Sung Chae, Incheon-kwangyokshi (KR)

(73) Assignee: LG Display Co., Ltd., Seoul (KR)

( * ) Notice: Subject to any disclaimer, the term of this patent is extended or adjusted under 35 U.S.C. 154(b) by 113 days.

(21) Appl. No.: 12/385,869

(22) Filed: Apr. 22, 2009

(65) Prior Publication Data

US 2009/0206751 A1 Aug. 20, 2009

Related U.S. Application Data

(62) Division of application No. 11/158,011, filed on Jun. 22, 2005, now abandoned.

(30) Foreign Application Priority Data

Jun. 25, 2004 (KR) ................................ P2004-48163

(51) Int. Cl.
*H01L 21/00* (2006.01)

(52) U.S. Cl. ............................. 438/34; 438/29; 438/149

(58) Field of Classification Search .................... 438/29, 438/34, 149
See application file for complete search history.

(56) References Cited

U.S. PATENT DOCUMENTS

| | | | | |
|---|---|---|---|---|
| 5,220,183 | A | 6/1993 | Taniguchi et al. | |
| 6,117,529 | A | 9/2000 | Leising et al. | |
| 6,551,440 | B2 * | 4/2003 | Tanaka | 156/292 |
| 6,712,661 | B1 | 3/2004 | Kiguchi et al. | |

FOREIGN PATENT DOCUMENTS

| | | |
|---|---|---|
| JP | 2000-010506 | 1/2000 |

* cited by examiner

*Primary Examiner* — Long Pham

(74) *Attorney, Agent, or Firm* — Morgan, Lewis & Bockius LLP

(57) ABSTRACT

An electro-luminescent device includes a transparent substrate, a black matrix on the transparent substrate defining a plurality of spaces, a plurality of color representing layers each arranged in respective ones of the spaces, an overcoat layer on the black matrix and the color representing layers, a plurality of first electrodes disposed on the overcoat layer in a first direction with respect to the color representing layers, a phosphor layer formed on the plurality of first electrodes, an insulating film on the phosphor layer, and a plurality of second electrodes disposed on the insulating film in a second direction perpendicular to the first direction.

12 Claims, 14 Drawing Sheets

ELECTRO-LUMINESCENT DEVICE AND METHOD FOR MANUFACTURING THE SAME

This is a divisional of U.S. patent application Ser. No. 11/158,011, filed Jun. 22, 2005 now abandoned, which is hereby incorporated by reference. This application claims the benefit of the Korean Patent Application No. P2004-048163, filed on Jun. 25, 2004 which is hereby incorporated by reference.

BACKGROUND OF THE INVENTION

1. Field of the Invention

The present invention relates to a display device, and more particularly, to an electro-luminescent device and a method for manufacturing the same.

2. Discussion of the Related Art

Recently, the display industry has flourished with the introduction of TFT-LCDs to the TV market, the growth of plasma display panel (PDP) TVs, the advent of next-generation displays such as organic electro-luminescent (EL) devices, and the like. In particular, the advent of diverse displays has been mainly concentrated on application to TVs and mobile equipment, thereby enabling consumers to select desired displays among a wide variety of displays. Also, it is expected that the advent of an inorganic EL device, the driving principle of which is similar to that of organic EL devices, will provide consumers with an opportunity to select another display in the future, even though such an inorganic EL device is still a nascent technology and has yet to enter the market.

Organic EL devices, as developed recently, have been used since 2002 for consumer goods such as displays for mobile phones. However, inorganic EL devices have yet to be widely recognized for consumer applications. Although inorganic EL devices are different from organic EL devices in terms of the manufacturing processes and whether the luminous material is an organic material or an inorganic material, inorganic EL devices have the same driving mechanism (using an electric field) as organic EL devices.

However, inorganic EL devices are improper for miniature devices (for example, mobile equipment) because inorganic EL devices involve electrical shock danger due to their high driving voltage in contrast to organic EL devices. On the other hand, inorganic EL devices have an advantage in larger displays because thin film transistors (TFTs) are unnecessary. In addition, inorganic EL devices are similar to PDPs in terms of the driving system because high driving voltages for luminescence of the inorganic material is necessary.

As compared to other displays, inorganic EL devices have remarkable advantages of low costs according to their simple manufacturing processes and of stable performance even in harsh environments. The inorganic EL devices also have a great advantage in that products can be manufactured using an inexpensive thin film process, as compared to TFT-LCDs and organic EL devices which require the use of thin film processes.

FIG. 1 is a circuit diagram schematically illustrating a general EL panel. As shown in FIG. 1, the EL panel includes gate lines GL1 to GLm and data lines DL1 to DLn which are arranged on a glass substrate 10 intersecting with each other. The EL panel also includes pixel elements PE each arranged at an intersection between each of the gate lines GL1 to GLm and each of the data lines DL1 to DLn.

Each pixel element PE is activated when a gate signal on an associated one of the gate lines GL1 to GLm is enabled. In the activated state, the pixel element PE emits light with an intensity corresponding to the level of a pixel signal on an associated one of the data lines DL1 to DLn.

To drive the EL panel, a gate driver 12 is connected to the gate lines GL1 to GLm, and a data driver 14 is connected to the data lines DL1 to DLn. The gate driver 12 sequentially activates the gate lines GL1 to GLm. The data driver 14 supplies pixel signals to the pixel elements PE via the data lines DL1 to DLn, respectively.

The pixel elements PE, which are driven by the gate drivers 12 and data drivers 14, will now be described. FIG. 2 is a circuit diagram illustrating one pixel element in the EL panel of FIG. 1.

As shown in FIG. 2, the pixel element includes an EL cell OLED having a cathode terminal connected to the ground, and a cell driving circuit 16 adapted to drive the EL cell OLED in accordance with a signal on a gate line GL and a signal on a data line DL. The EL cell driving circuit 16 includes a first PMOS TFT T1 adapted to perform a switching operation for the data signal on the data line DL in accordance with the signal on the gate line GL, and a second PMOS TFT T2 adapted to supply a voltage to the EL cell OLED in accordance with the data signal on the data line DL. The EL cell driving circuit 16 also includes a storage capacitor Cst connected between gate and source terminals of the second PMOS TFT T2 to maintain the data signal received via the first PMOS TFT T1 for a predetermined time.

Hereinafter, a related art method for manufacturing an EL device will be described with reference to the drawings. FIGS. 3A to 3E are sectional views illustrating processing steps of the related art EL device manufacturing method.

As shown in FIG. 3A, first electrodes 22 are first formed on a transparent substrate 21 such that the first electrodes 22 are uniformly spaced apart from one another in a column direction, using a method in which an organic material containing metal grains is printed on the transparent substrate 21. Here, each first electrode 22 is a reflective electrode made of Al exhibiting excellent reflectivity.

Thereafter, as shown in FIG. 3B, an insulating film 23 is formed over the entire surface of the transparent substrate 21 such that a predetermined portion of each first electrode 22 at one side of the first electrode 22 is exposed. The first electrodes 22 exposed through the insulating film 23 function as first pad terminals, respectively.

As shown in FIG. 3C, a phosphor layer 24 is then formed on the insulating film 23 in accordance with a sputtering method under the condition in which a shadow mask (not shown) is used. For the phosphor layer 24, a blue phosphor layer may be used.

Subsequently, as shown in FIG. 3D, transparent metal (for example, indium tin oxide (ITO) or the like) is deposited over the entire surface of the transparent substrate 21 including the phosphor layer 24 in accordance with a sputtering method. The transparent metal deposited in accordance with the sputtering method is then selectively removed using a laser ablation technique, to form a plurality of second electrodes 25 uniformly spaced apart from one another in a row direction perpendicular to the first electrodes 22. The second electrodes 25 function as transparent electrodes, respectively. The second electrode 25, which is arranged at one outermost portion of the substrate 21 corresponding to the side of the first pad terminals, is a second pad terminal.

Thereafter, red (R), green (G), and blue (B) color representing layers 26 are formed around the second electrodes 25, as shown in FIG. 3E. A protective film (not shown) is formed over the entire surface of the resulting structure of the EL device obtained in accordance with the above-mentioned processes, to protect the EL device. After performing a sealing process, the EL device is connected to driving circuits or chips via the first and second pad terminals, using TCPs. That is, the EL device is connected to a gate driver and a data driver to receive signals from the drive, thereby displaying an image.

However, the above-mentioned related art EL device manufacturing method has various problems. That is, first, the phosphor layer may be damaged when the transparent metal layer is deposited over the phosphor layer and is then selectively removed to form the second electrodes (transparent electrodes). As a result, the throughput may be degraded. Second, addition of a function to reduce the damage is necessary. Furthermore, the second electrodes are formed using laser ablation because the phosphor layer exhibits poor resistance to wet etching. For this reason, the utility of existing LCD manufacturing equipment is degraded.

SUMMARY OF THE INVENTION

Accordingly, the present invention is directed to an EL device and a method for manufacturing the same that substantially obviate one or more problems due to limitations and disadvantages of the related art.

An object of the present invention is to provide an EL device and a method for manufacturing the same, which do not use a laser ablation technique, but use a wet etching process while protecting a phosphor layer from wetness, thereby being capable of preventing a degradation in the utility of equipment while achieving an enhancement in throughput and process reproducibility.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an electro-luminescent device comprises a transparent substrate; a black matrix on the transparent substrate defining a plurality of spaces; a plurality of color representing layers each arranged in respective ones of the spaces; an overcoat layer on the black matrix and the color representing layers; a plurality of first electrodes disposed on the overcoat layer in a first direction with respect to the color representing layers; a phosphor layer formed on the plurality of first electrodes; an insulating film on the phosphor layer; and a plurality of second electrodes disposed on the insulating film in a second direction perpendicular to the first direction.

In another aspect, a method for manufacturing an electroluminescent device comprises the steps of forming a black matrix on a transparent substrate, the black matrix defining a plurality of spaces; forming color representing layers each arranged in respective ones of the spaces; forming an overcoat layer over an entire surface of the transparent substrate including the color representing layers; forming a plurality of first electrodes on the overcoat layer on the overcoat layer in a first direction with respect to the color representing layers; forming a phosphor layer on the plurality of first electrodes; forming an insulating film on the phosphor layer; and forming a plurality of second electrodes on the insulating film in a second direction perpendicular to the first direction.

In another aspect, a method for manufacturing an electroluminescent device comprises the steps of forming a black matrix on a transparent substrate, the black matrix defining a plurality of spaces; forming color representing layers each arranged in respective ones of the spaces; forming an overcoat layer over an entire surface of the transparent substrate including the color representing layers; forming a plurality of first electrodes on the overcoat layer in a first direction with respect to the color representing layers, each of the first electrodes having a double-layer structure including a first metal film and a second metal film; forming first and second pad terminals on the overcoat layer respectively disposed at regions opposite where the first electrodes are arranged such that the first and second pad terminals are spaced from the region where the first electrodes are arranged; forming a phosphor layer on the first electrodes; forming an insulating film on the phosphor layer and portions of the first and second pad terminals; and forming a plurality of second electrodes on the insulating film connected to the first pad terminal such that the second electrodes are uniformly spaced apart from one another in a second direction perpendicular to the first direction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
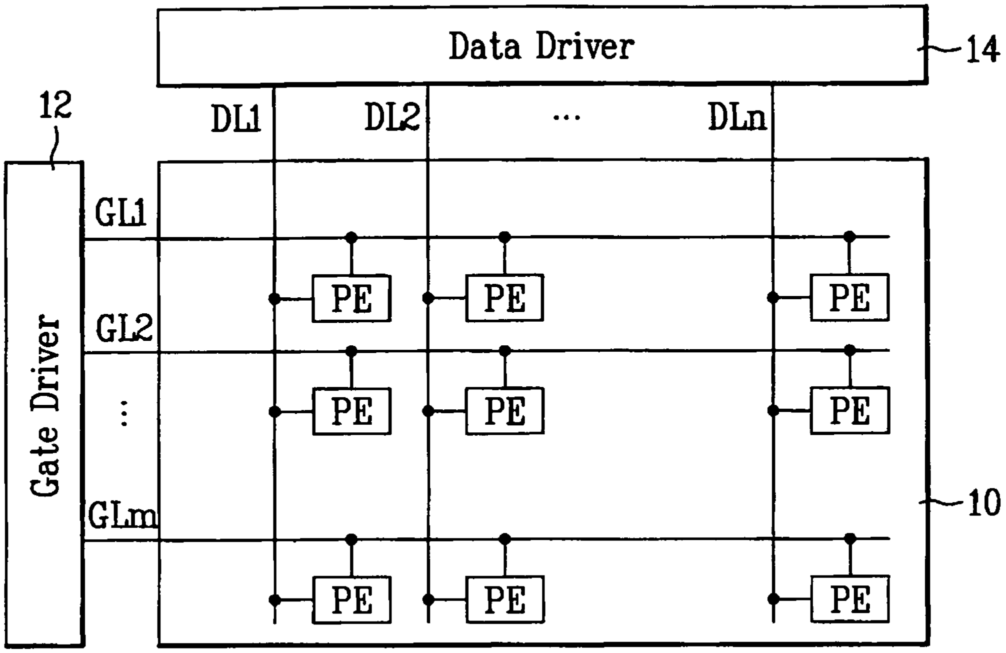
FIG. 1 Related Art
FIG. 1 is a circuit diagram schematically illustrating a related art EL panel.
Figure 2:
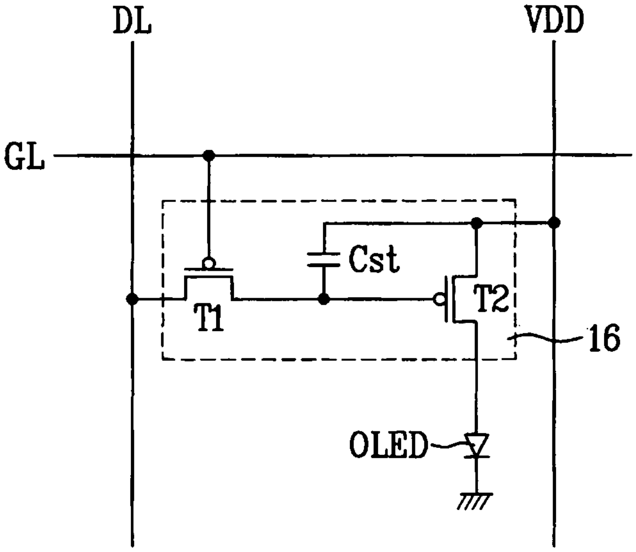
FIG. 2 Related Art
FIG. 2 is a circuit diagram illustrating one pixel element in the EL panel of FIG. 1.
Figure 3A:
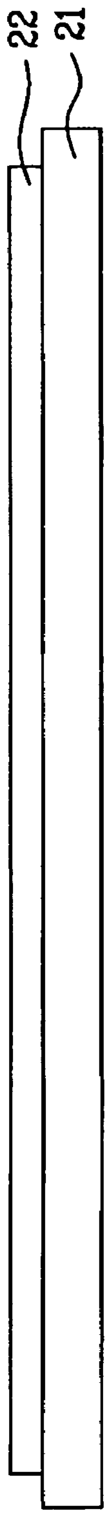
FIG. 3A Related Art
FIGS. 3A to 3E are sectional views illustrating processing steps of a related art EL device manufacturing method, respectively.
Figure 3B:
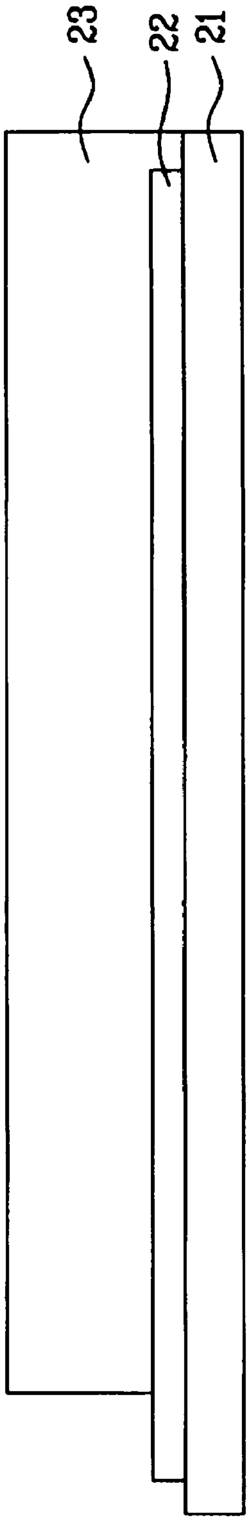
FIG. 3B Related Art
Figure 3C:
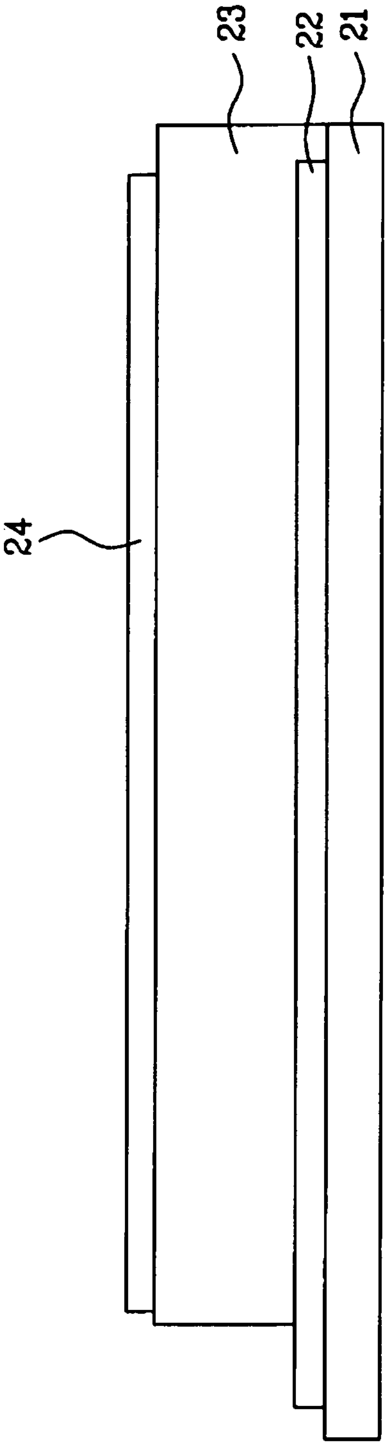
FIG. 3C Related Art
Figure 3D:
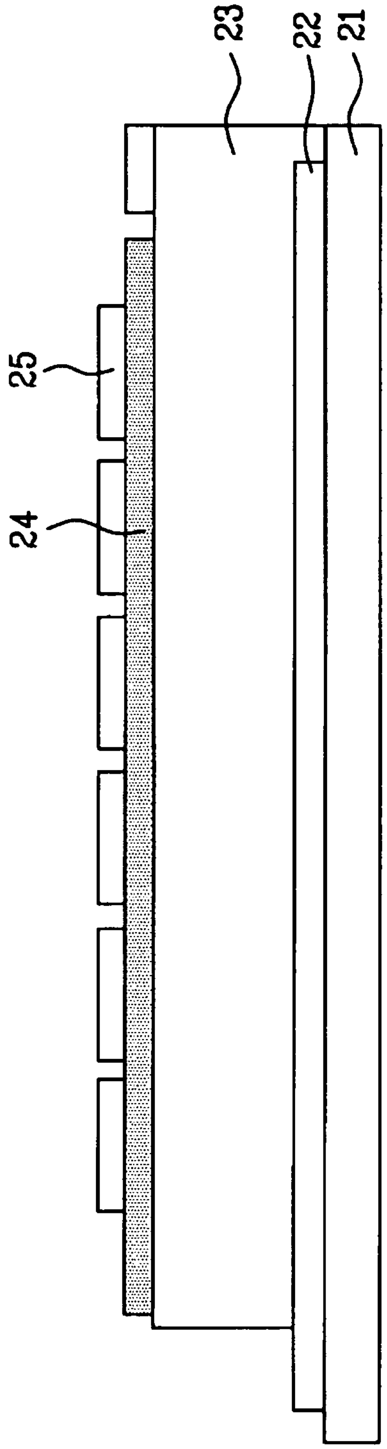
FIG. 3D Related Art
Figure 3E:
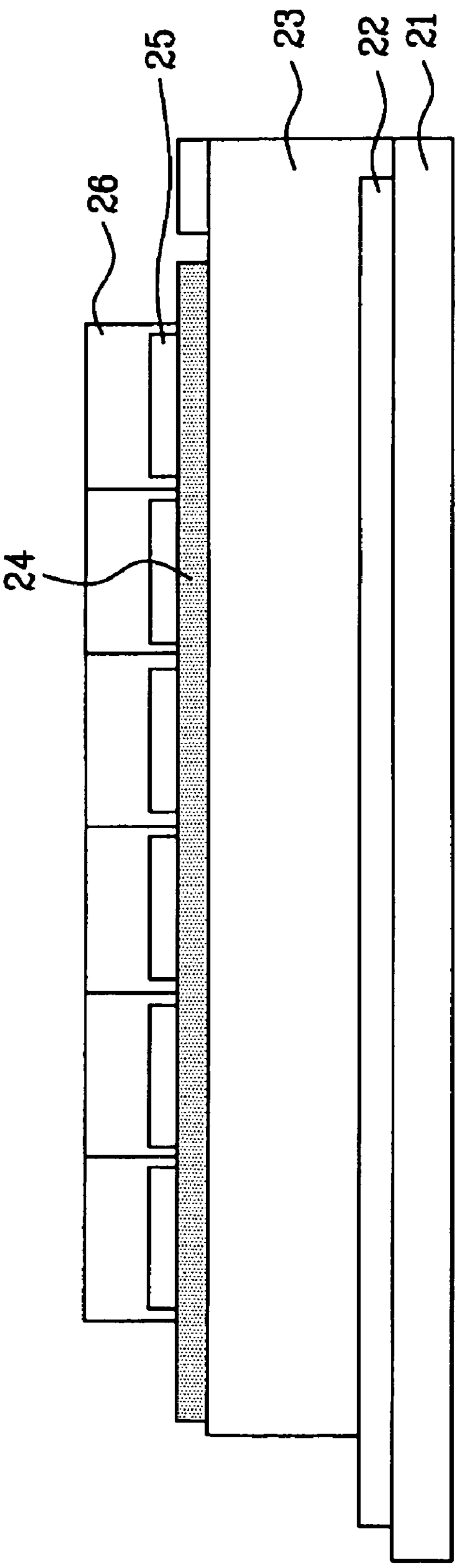
FIG. 3E Related Art
Figure 4:
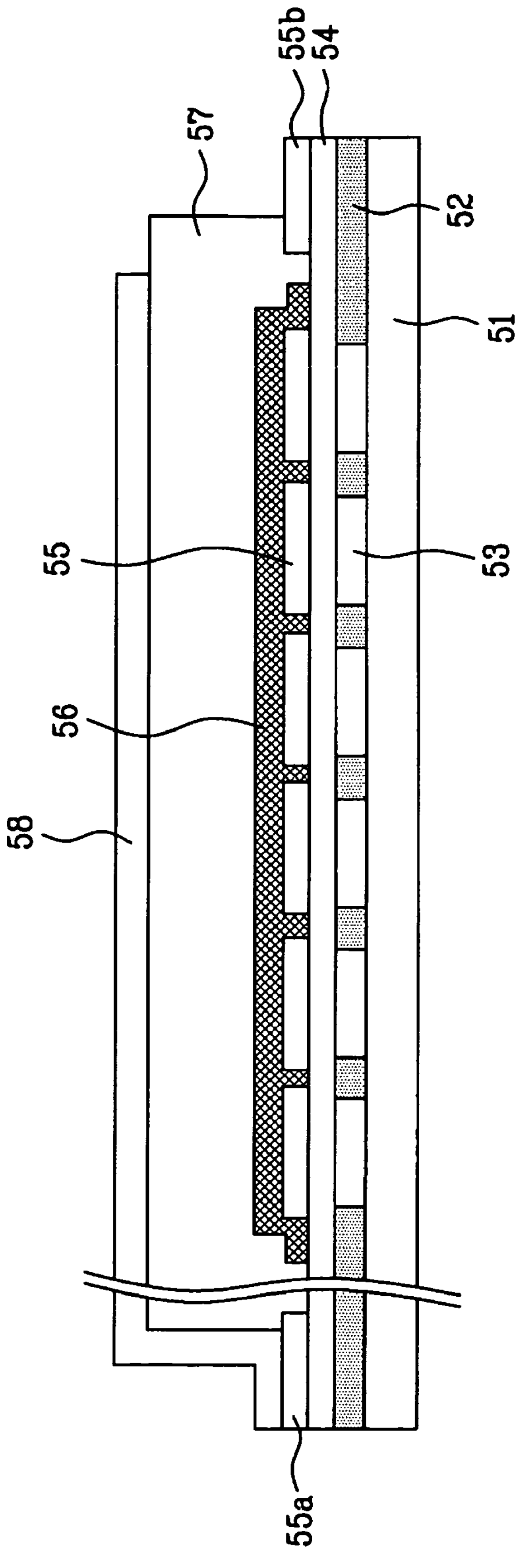
FIG. 4 is a sectional view illustrating a structure of an EL device according to a first exemplary embodiment of the present invention.

FIG. 4 is a sectional view illustrating a structure of an EL device according to a first exemplary embodiment of the present invention.

As shown in FIG. 4, the EL device according to the first exemplary embodiment of the present invention includes a plurality of black matrices 52 which are arranged on a transparent substrate 51 and are uniformly spaced apart from one another. The black matrices 52 are made of a metal such as chromium or a carbon-based organic material to have a thin film structure. The EL device also includes R, G, and B color representing layers 53 each arranged between adjacent ones of the black matrices 52, an overcoat layer 54 formed over the entire surface of the transparent substrate 51 including the color representing layers 53, a plurality of first electrodes 55 formed on the overcoat layer 54 to extend in a column direction while being uniformly spaced apart from one another in a row direction, and first and second pad terminals 55*a* and 55*b* respectively formed at opposite outermost portions of the overcoat layer 54 while being spaced apart in the row direction from an electrode region where the first electrodes 55 are arranged. The EL device further includes a phosphor layer 56 formed at the electrode region to cover the first electrodes 55, an insulating film 57 formed on the transparent substrate 51 including the phosphor layer 56 while allowing predetermined portions of the first and second pad terminals 55*a* and 55*b* to be exposed, and a plurality of second electrodes 58 formed on the insulating film 57 to extend in the row direction perpendicular to the first electrodes 55 while being uniformly spaced apart from one another in the column direction.

Each color representing layer 53 may comprise a color filter layer generally used in LCDs. Where the phosphor layer 56 is a blue phosphor layer, a color changing medium (CCM) may be used for each color representing layer 53. Also, each color representing layer 53 is formed between adjacent ones of the black matrices 52 to be flush with the black matrices 52.

The first electrodes 55 correspond to respective color representing layers 53. Each first electrode 55 is made of a transparent conductive material, for example, indium tin oxide (ITO) or indium zinc oxide (IZO). Each second electrode 58 is made of a metal exhibiting excellent reflectivity, such as Al.

Hereinafter, a method for manufacturing the EL device having the above-described structure according to the first exemplary embodiment of the present invention will be described. FIGS. 5A to 5E are sectional views illustrating processing steps of the method for manufacturing the EL device according to the first embodiment of the present invention.

Figure 5A:
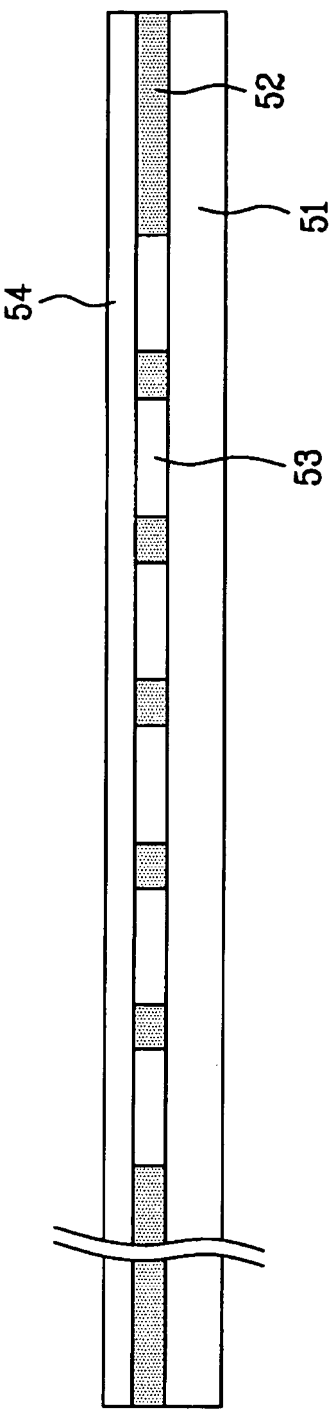
FIGS. 5A to 5E are sectional views illustrating steps of a method for manufacturing the EL device according to the first embodiment of the present invention.

As shown in FIG. 5A, black matrices 52, which divide the color filter pattern cells and shield light, are formed on a transparent substrate 51. The black matrices 52 are made of a metal such as chromium or a carbon-based organic material to have a thin film structure.

Thereafter, R, G, and B color representing layers 53 are formed between adjacent ones of the black matrices 52, respectively. The formation of the color representing layers 53 may be achieved using a dyeing method, a printing method, an electro-deposition method, a pigment dispersion method, or a film transfer method.

The pigment dispersion method is a method wherein a color representing layer is formed from a photoresist film of a photoresist material with a pigment dispersed therein using sequential processes of coating, exposure, development, baking, and the like. Using this method, R, G, and B color representing layers can be formed. That is, the R, G, and B color representing layers are formed by coating a photoresist over the transparent substrate 51 formed with the black matrices 52, using a spin coating method, and then exposing and developing the photoresist. For the formation of the R, G, and B color representing layers 53, screen masks respectively formed with R, G, and B patterns are used. Through a single process, color representing layers 53 respectively having R, G, and B patterns may be simultaneously formed.

Figure 5B:
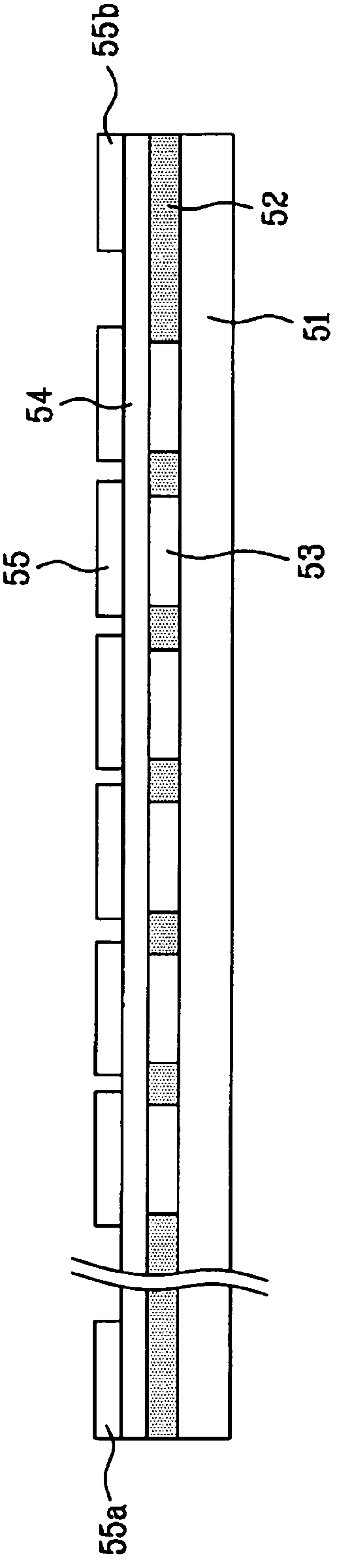

An overcoat layer 54, which is a protective layer having insulating and leveling functions, is then formed over the entire surface of the transparent substrate 51 including the color representing layers 53. Subsequently, as shown in FIG. 5B, a plurality of first electrodes 55 and first and second pad electrodes 55*a* and 55*b* are formed on the transparent substrate 51 with the overcoat layer 54 where a transparent metal, such as ITO, IZO, or indium tin zinc oxide (ITZO), is used as a shadow mask so that the first electrodes 55 extend in the column direction while being uniformly spaced apart from one another in the row direction, and the first and second pad electrodes 55*a* and 55*b* are arranged at opposite outermost portions of the substrate 51 in the row direction, respectively. The first electrodes 55 correspond to respective color representing layers 53.

Although the first electrodes 55 have been described as being formed using a shadow mask in the illustrated exemplary case, the first electrodes 55 may be formed by depositing a transparent metal using a sputtering process and subjecting the transparent metal to a photolithography process. Also, the first electrodes 55 may be formed by selectively removing the transparent metal using a laser ablation technique.

Figure 5C:
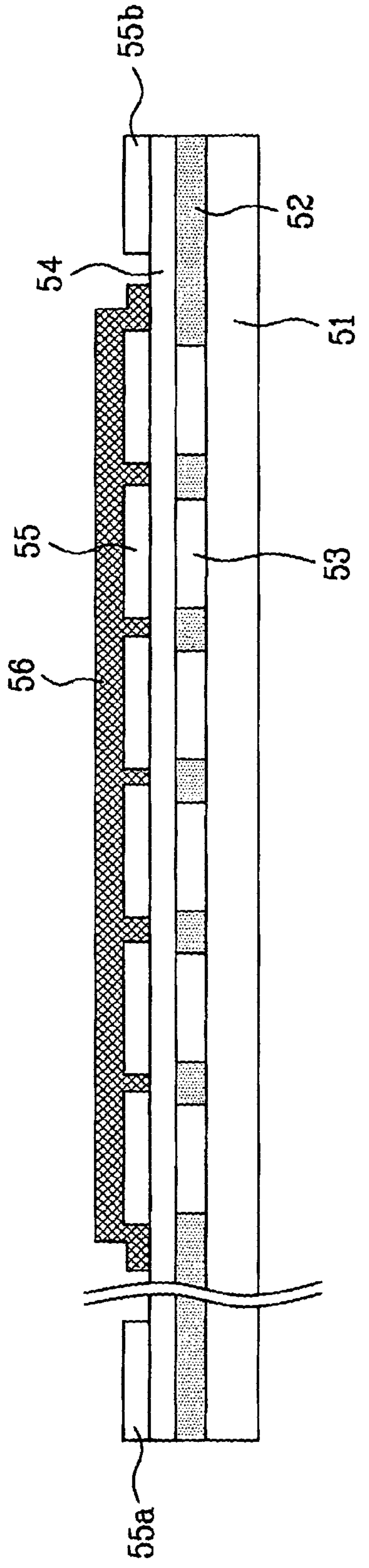

Next, a phosphor material layer 56 is formed on the transparent substrate 51 with the first electrodes 55 using a spin coating or printing method, as shown in FIG. 5C. During the formation of the phosphor layer 56, the first and second pad terminals 55*a* and 55*b* are maintained in a masked state. Where a blue phosphor layer is used for the phosphor layer 56, a CCM layer may be used for each color representing layer 53.

Figure 5D:
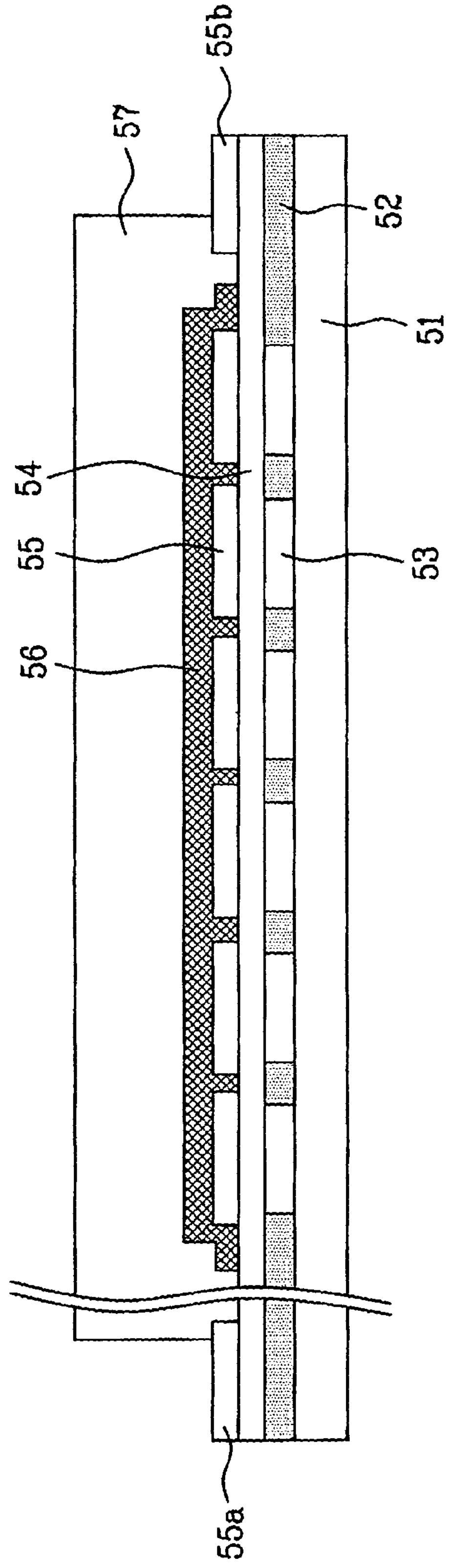

Thereafter, as shown in FIG. 5D, an insulating film 57 is formed on the transparent substrate 51 using a printing method such that predetermined portions of the first and second pad terminals 55*a* and 55*b* are exposed. Although the formation of the insulating film 57 has been described as being achieved using a printing method, the insulating film 57 may alternatively be formed by depositing an insulating material using a sputtering or chemical vapor deposition (CVD) method, and selectively removing predetermined portions of the deposited film using a photolithography process.

Figure 5E:
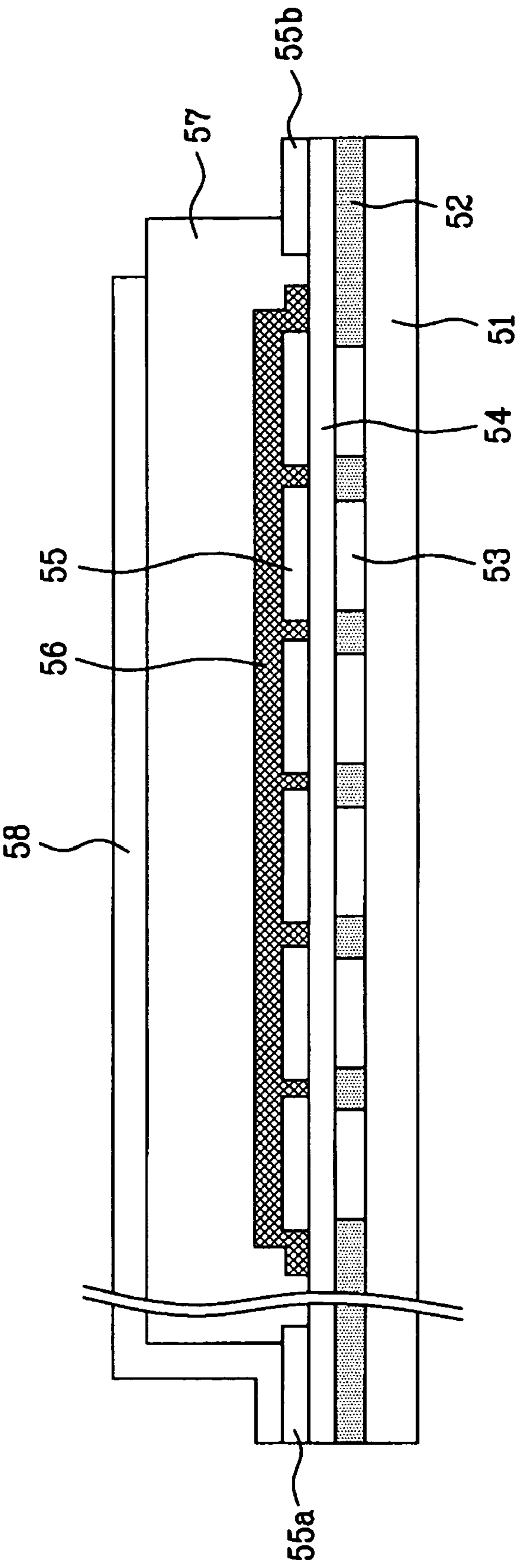

A metal film of laminated Al/Ti films is then deposited over the entire surface of the transparent substrate 51 including the insulating film 57. The metal film is subsequently selectively removed through a photolithography process to form a plurality of second electrodes 58, as shown in FIG. 5E, extending in a direction perpendicular to the first electrodes 55 while being uniformly spaced apart from one another.

Even when a wet etching process is used for the formation of the second electrodes 58, damage to the phosphor layer 56 can be prevented because the insulating film 57 covers the phosphor layer 56. Meanwhile, the second electrodes 58 may alternatively be formed through a printing method using a shadow mask. For the metal film of the second electrodes 58, Al or Ag exhibiting excellent reflectivity may be used.

The second electrodes 58 are connected to the first pad terminal 55*a* which is, in turn, electrically connected with an external driving circuit via TCPs (not shown), along with the second pad terminal 55*b*. Accordingly, each second electrode 58 can receive a signal from the external driving circuit.

Figure 6:
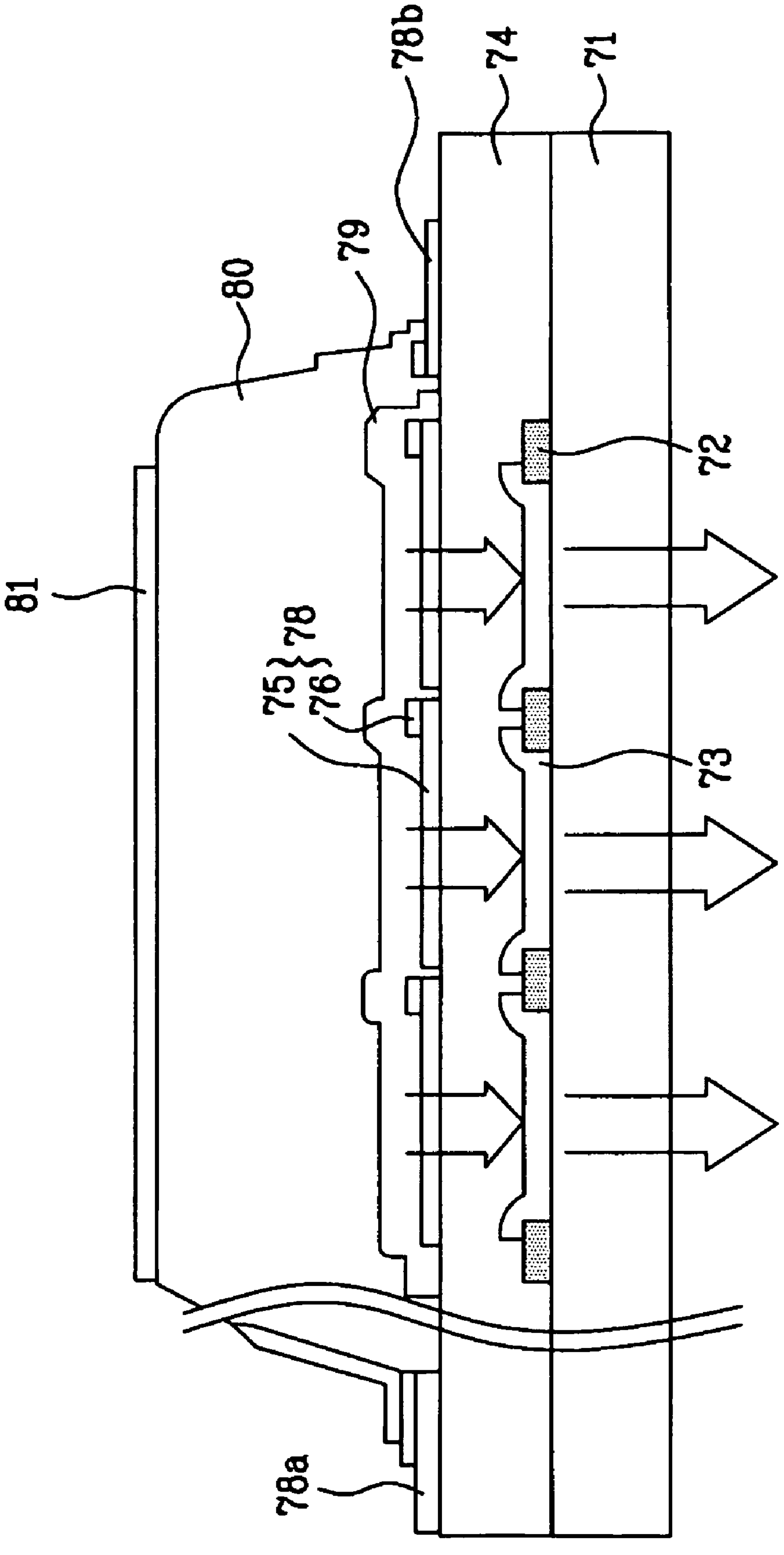
FIG. 6 is a sectional view illustrating a structure of an EL device according to a second exemplary embodiment of the present invention.

FIG. 6 is a sectional view illustrating a structure of an EL device according to a second exemplary embodiment of the present invention.

As shown in FIG. 6, the EL device according to the second embodiment of the present invention includes a plurality of black matrices 72 which are arranged on a transparent substrate 71 and are uniformly spaced apart from one another.

The black matrices 72 is made of a metal such as chromium or a carbon-based organic material to have a thin film structure. The EL device also includes R, G, and B color representing layers 73 each arranged between adjacent ones of the black matrices 72, an overcoat layer 74 formed over the entire surface of the transparent substrate 71 including the color representing layers 73, and a plurality of first electrodes 78 formed on the overcoat layer 74 to extend in a column direction while being uniformly spaced apart from one another in a row direction. Each first electrode 78 is formed at a position corresponding to an associated one of the color representing layers 73, and has a double-layer structure of a transparent metal film 75 and a molybdenum film 76. The EL device further includes first and second pad terminals 78*a* and 78*b* respectively formed at opposite outermost portions of the overcoat layer 74 while being spaced apart in the row direction from an electrode region where the first electrodes 78 are arranged. The EL device further includes a phosphor layer 79 formed at the electrode region on the transparent substrate 71 to cover the first electrodes 78, an insulating film 80 formed on the transparent substrate 71 including the phosphor layer 79 while allowing predetermined portions of the first and second pad terminals 78*a* and 78*b* to be exposed, and second electrodes 81 formed on the insulating film 80 to be connected to the first pad terminal 78*a* while extending in the row direction perpendicular to the first electrodes 78 in a state of being uniformly spaced apart from one another in the column direction.

Each first electrode 78 has a double-layer structure of the transparent metal film 75 and molybdenum film 76. The molybdenum film 76, which is formed on the transparent metal film 75, is arranged at an edge region of the transparent metal film 75 except for an opening region (light transmission region) of the transparent metal film 75 without completely covering the transparent metal film 75.

The first and second pad terminals 78*a* and 78*b* are partially exposed for TCP bonding. Each color representing layer 73 is arranged between adjacent ones of the black matrices 72 such that the color representing layer 73 overlap the facing ends of the adjacent black matrices 72. The color representing layers 73 are arranged repeatedly in the order of R, G, and B while being spaced apart from one another.

Each color representing layer 73 may comprise a color filter layer generally used in LCDs. Where the phosphor layer 79 is a blue phosphor layer, a CCM may be used for each color representing layer 73. The arrows in FIG. 6 show a principle wherein R, G, and B visible rays emitted from the phosphor layer 79 via respective R, G, and B color representing layers 73 are transmitted through the first electrodes 78.

Hereinafter, a method for manufacturing the EL device having the above-described structure according to the second embodiment of the present invention will be described. FIGS. 7A to 7H are sectional views illustrating processing steps of the method for manufacturing the EL device according to the second exemplary embodiment of the present invention.

Figure 7A:
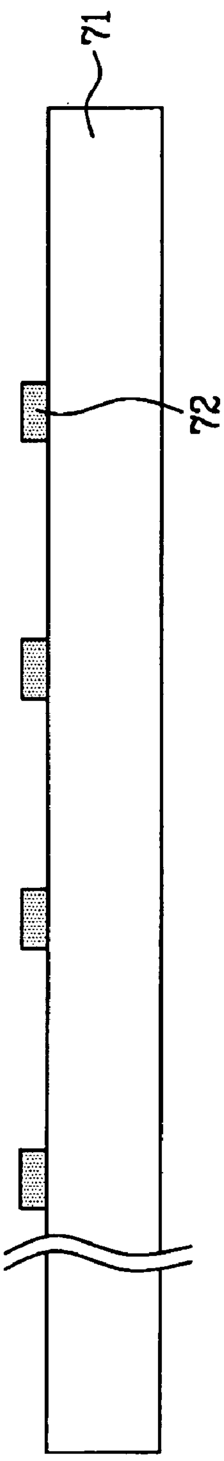
FIGS. 7A to 7H are sectional views illustrating steps of a method for manufacturing the EL device according to the second embodiment of the present invention.

As shown in FIG. 7A, black matrices 72, which divide cells of color filter patterns, and function to shield light, are formed on a transparent substrate 71. The black matrices 72 are made of a metal such as chromium or a carbon-based organic material as a thin film.

Figure 7B:
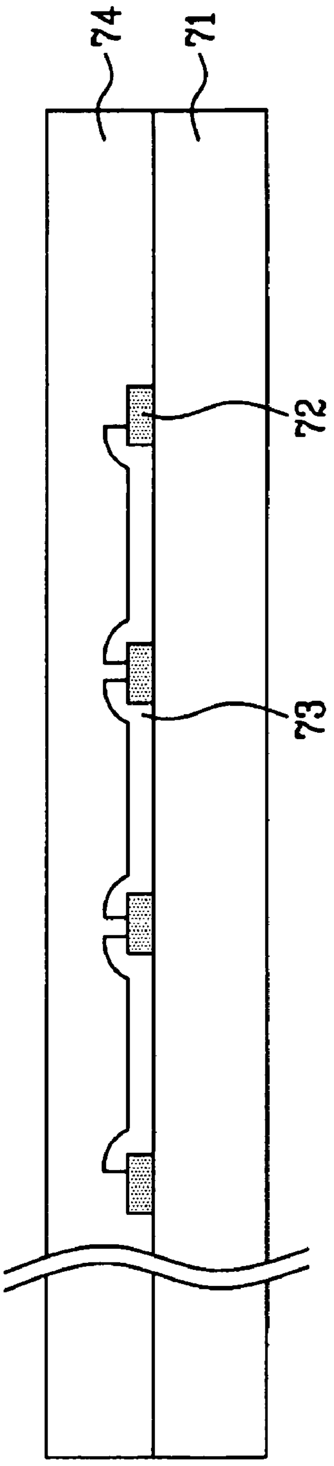

Thereafter, R, G, and B color representing layers 73 are formed between adjacent ones of the black matrices 72, respectively, as shown in FIG. 7B. The formation of the color representing layers 73 may be achieved using a dyeing method, a printing method, an electro-deposition method, a pigment dispersion method, or a film transfer method.

As described above, the pigment dispersion method is a method wherein a color representing layer is formed from a photoresist film made of a photoresist dispersed with a pigment using sequential processes of coating, exposure, development, baking, and the like. Using this method, R, G, and B color representing layers can be formed. That is, the R, G, and B color representing layers are formed by coating a photoresist over the transparent substrate 71 formed with the black matrices 72 using a spin coating method, and then exposing and developing the photoresist. For the formation of the R, G, and B color representing layers 73, screen masks respectively formed with R, G, and B patterns are used. Through a single process, color representing layers 73 respectively having R, G, and B patterns may be simultaneously formed.

Figure 7C:
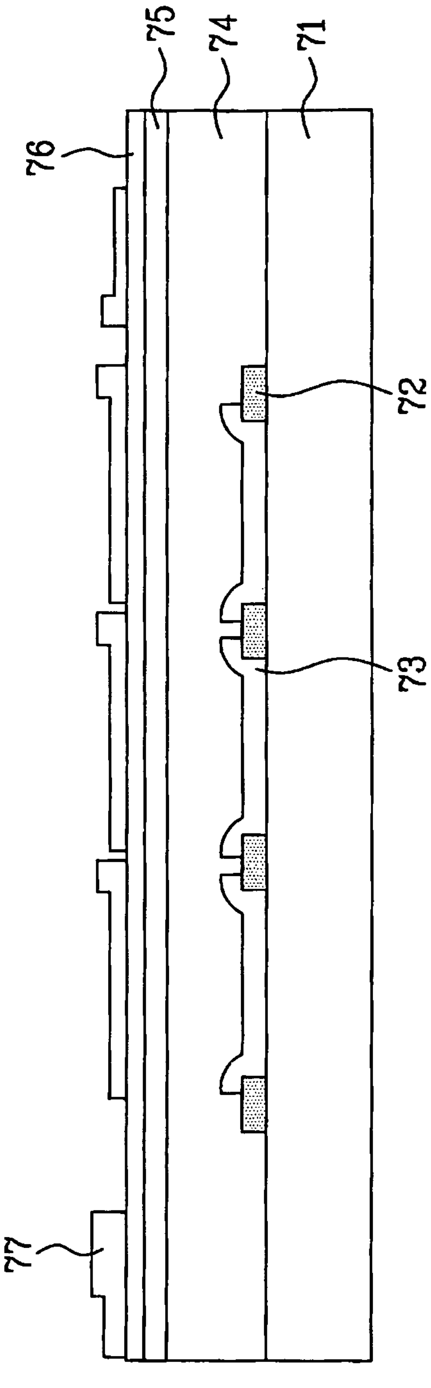

An overcoat layer 74, which is a protective layer having insulating and leveling functions, is then formed over the entire surface of the transparent substrate 71 including the color representing layers 73. Subsequently, as shown in FIG. 7C, a transparent metal film 75 made of ITO, IZO, or ITZO, and a molybdenum film 76 are sequentially formed over the transparent substrate 71 formed with the overcoat layer 74.

Thereafter, a photoresist 77 is coated over the molybdenum film 76. The photoresist 77 is then patterned using diffraction exposure and development processes. When the diffraction exposure process is carried out to expose the entire surface of the photoresist 77 to light under the condition in which a diffraction mask—having a slit region, a shield region, and a transmission region—is arranged above the photoresist 77 with the portion of the photoresist 77 corresponding to the transmission region is completely exposed to the light. In contrast, the portion of the photoresist 77 corresponding to the shield region is not exposed to the light. The portion of the photoresist 77 corresponding to the slit region is partially exposed to the light so that the photoresist 77 remains at the portion corresponding to the slit region in a thickness less than that of the other portion of the photoresist 77.

Figure 7D:
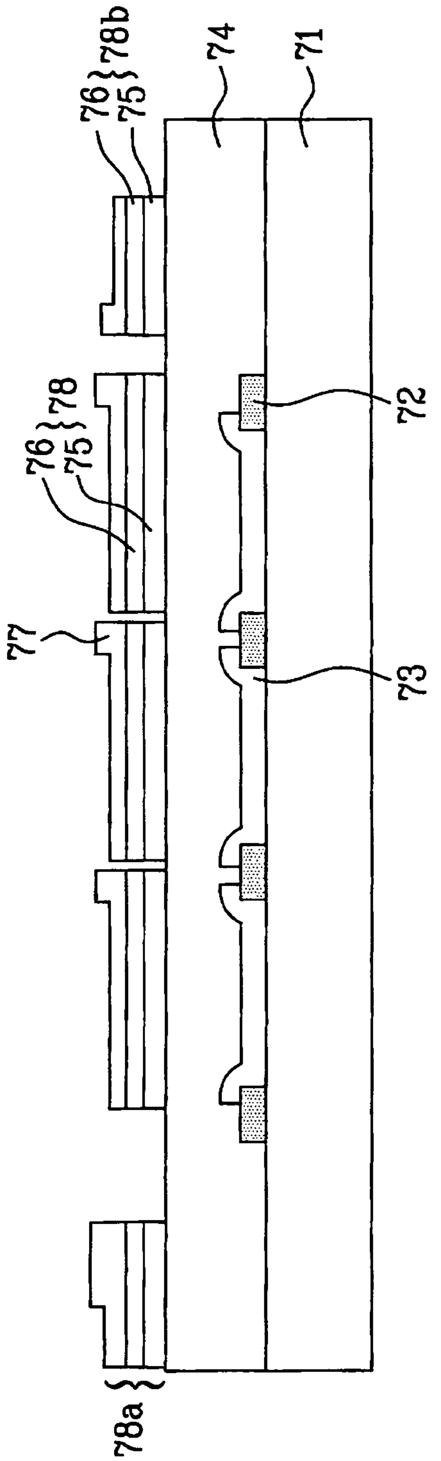

Using the patterned photoresist 77 as a mask, the molybdenum film 76 and transparent metal film 75 are primarily selectively removed to form a plurality of first electrodes 78 extending in the column direction while being uniformly spaced apart from one another in the row direction, as shown in FIG. 7D. Simultaneously with the formation of the first electrodes 78, first and second pad electrodes 78*a* and 78*b* are formed at regions arranged adjacent to outermost ones of the first electrodes 78 in the row direction, respectively. The first and second pad electrodes 78*a* and 78*b* are TCP bonding regions for application of signals from external driving circuits, respectively. The first electrodes 78 are formed to correspond to respective color representing layer 73.

Figure 7E:
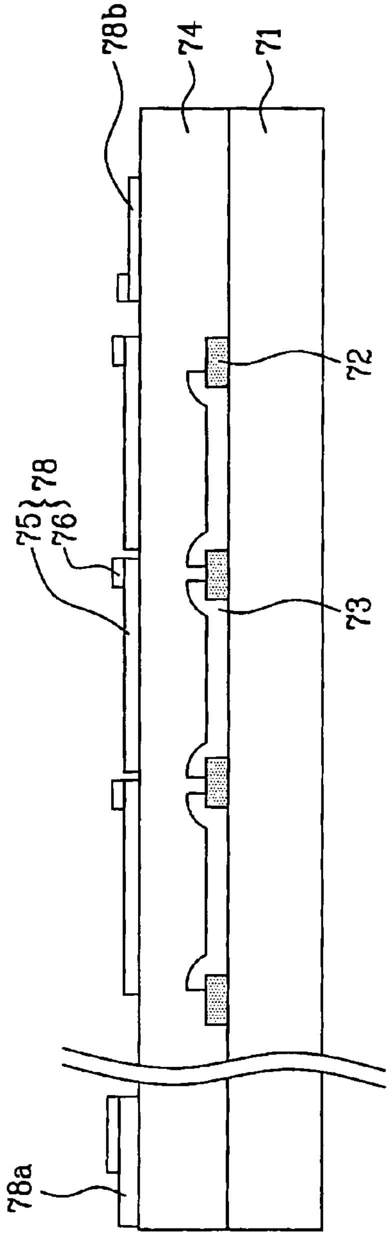

As shown in FIG. 7E, the patterned photoresist 77 is then subjected to an ashing process such that only the portion of the photoresist 77 corresponding to the shield region of the diffraction mask remains. Using the remaining photoresist 77 as a mask, the molybdenum film 76 is selective removed to form the first electrodes 78 which extend in the column direction while being uniformly spaced apart from one another in the row direction. That is, the portion of the photoresist 77 corresponding to the slit region of the diffraction mask is removed in the ashing process. In this case, the other portion of the photoresist 77 remains in a predetermined thickness. Using the remaining photoresist 77 as a mask, only the molybdenum film 76 arranged on the transparent metal film 75 is selectively removed to expose the transparent metal film 75.

The removal of the molybdenum film 76 is achieved through a dry etching process. The portion of the transparent metal film 75 corresponding to a region, from which the molybdenum film 76 is removed, is an opening region (light transmission region). Subsequently, the photoresist 77 used as the mask to form the first electrodes 78 is removed.

Figure 7F:
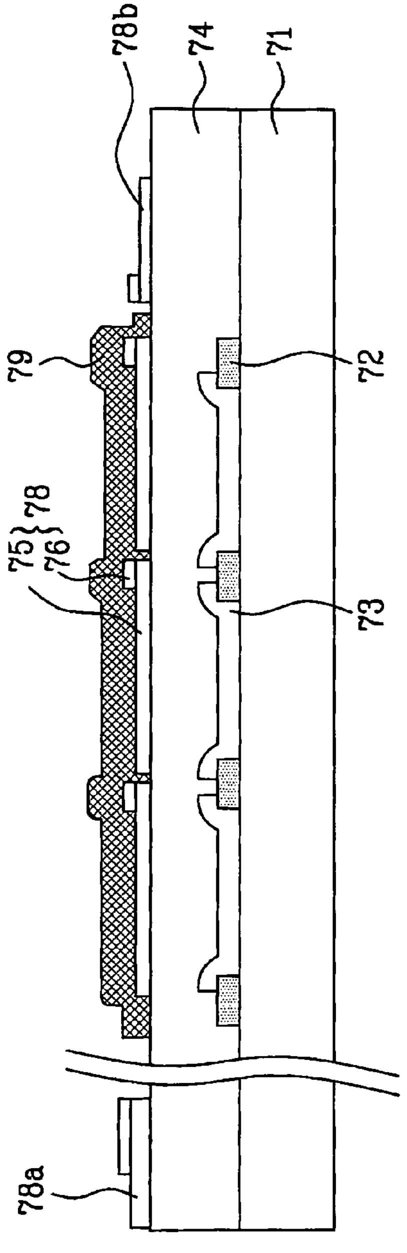

As shown in FIG. 7F, a phosphor material layer 79 is then formed on the transparent substrate 71 with the first electrodes 78 using a spin coating or printing method. During the formation of the phosphor layer 79, the first and second pad terminals 78*a* and 78*b* are maintained in a masked state. Where a blue phosphor layer is used for the phosphor layer 79, a CCM layer may be used for each color representing layer 73.

Figure 7G:
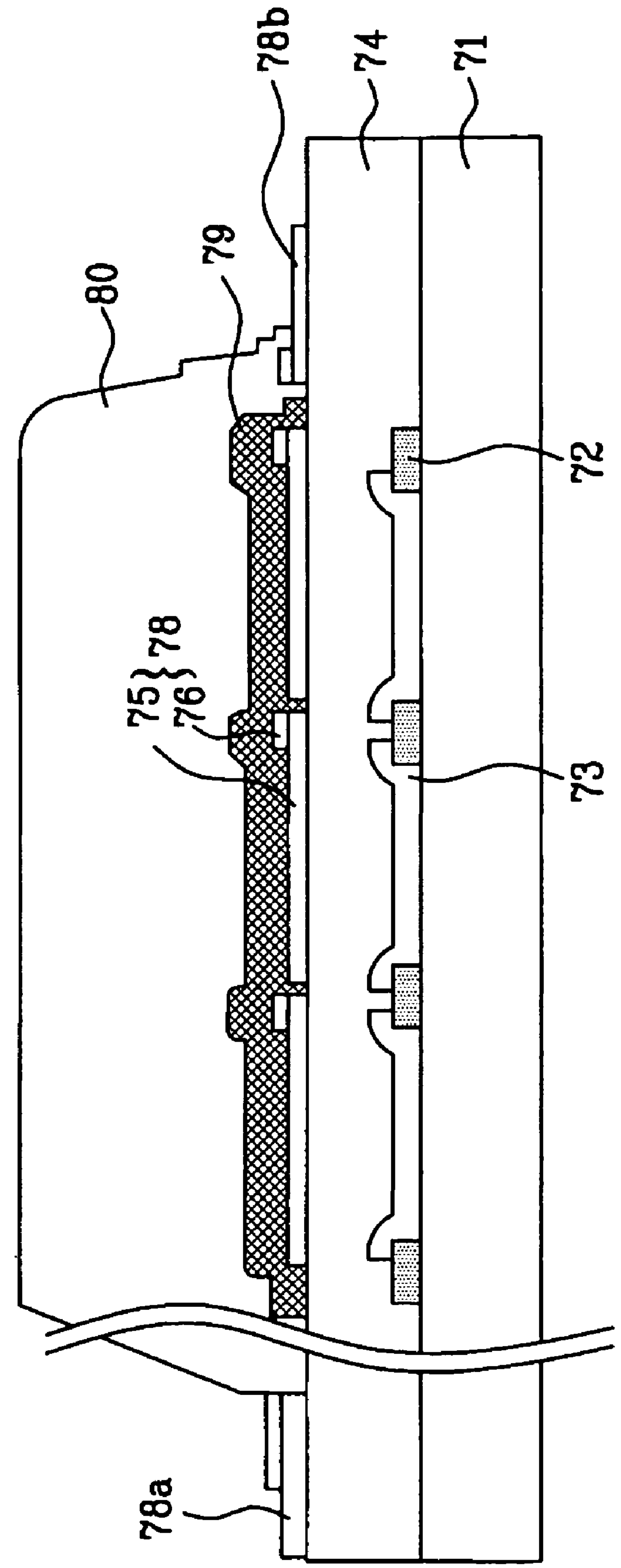

Thereafter, as shown in FIG. 7G, an insulating film 80 is formed on the transparent substrate 71 formed with the phosphor layer 79, using a printing method, such that predetermined portions of the first and second pad terminals 78*a* and 78*b* are exposed. Although the formation of the insulating film 80 has been described as being achieved using a printing method, the insulating film 80 may alternatively be formed by depositing an insulating material using a sputtering or CVD method and then selectively removing predetermined portions of the deposited film using a photolithography process.

Figure 7H:
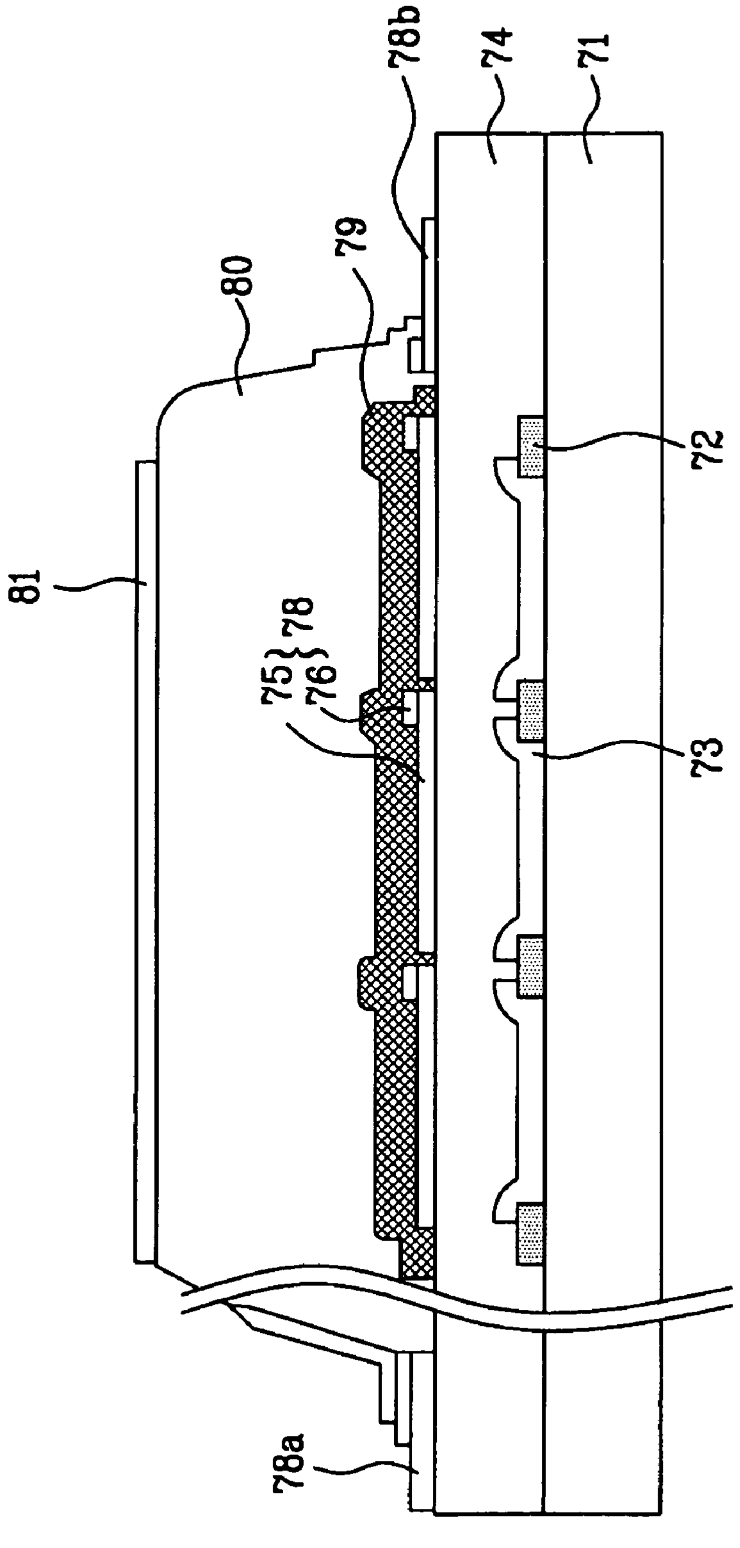

A metal film consisting of laminated Al/Ti films is then deposited over the entire surface of the transparent substrate 71 including the insulating film 80. The metal film is subsequently selectively removed through a photolithography process to form a plurality of second electrodes 81, as shown in FIG. 7H, extending in the row direction perpendicular to the first electrodes 78 while being uniformly spaced apart from one another in the column direction.

The second electrodes 81 are electrically connected to the first pad terminal 78*a*. In the illustrated example, the first pad terminal 78*a* has the same double-layer structure as the first electrodes 78, so that the first pad terminal 78*a* includes the transparent metal film 75 and the molybdenum film 76. In this case, the second electrodes 81 are electrically connected to the molybdenum film 76 of the first pad terminal 78*a*. The transparent metal film 75 of the first pad terminal 78*a*, which is not electrically connected with the second electrodes 81, is a TCP bonding region for application of a signal from the associated external driving circuit.

Even when a wet etching process is used for the formation of the second electrodes 81, damage of the phosphor layer 79 is prevented because the insulating film 80 covers the phosphor layer 79. Meanwhile, the second electrodes 81 may alternatively be formed through a printing method using a shadow mask. For the metal film of the second electrodes 81, Al or Ag exhibiting excellent reflectivity may be used.

The above-described EL device and manufacturing method thereof according to the present invention have various effects. First, it is possible to achieve an enhancement in throughput because the phosphor layer is protected by the insulating film after the formation of the phosphor layer to prevent the phosphor layer from being exposed to various treating agents used in subsequent processes, and to protect the phosphor layer against humidity. Second, since the second electrodes (reflective electrodes) extending in the row direction electrically contact the pad having the double-layer structure of the transparent metal film and molybdenum film, it is possible to solve problems associated with contact resistance and to prevent an electro-etch phenomenon from occurring during the etching process. Third, it is possible to enhance the utility of equipment, using a color filter manufacturing technique for the manufacture of LCDs.

It will be apparent to those skilled in the art that various modifications and variations can be made in the electro-luminescent device and method for manufacturing the same of the present invention without departing from the spirit or scope of the invention. Thus, it is intended that the present invention cover the modifications and variations of this invention provided they come within the scope of the appended claims and their equivalents.

What is claimed is:

1. A method for manufacturing an electro-luminescent device, comprising the steps of:

forming a black matrix on a transparent substrate, the black matrix defining a plurality of spaces;

forming color representing layers each arranged in respective ones of the spaces;

forming an overcoat layer over an entire surface of the transparent substrate including the color representing layers;

forming a plurality of first electrodes on the overcoat layer in a first direction with respect to the color representing layers, each of the first electrodes having a double-layer structure including a first metal film and a second metal film;

forming first and second pad terminals on the overcoat layer respectively disposed at regions opposite where the first electrodes are arranged such that the first and second pad terminals are spaced from the region where the first electrodes are arranged;

forming a phosphor layer on the first electrodes;

forming an insulating film on the phosphor layer and portions of the first and second pad terminals; and forming a plurality of second electrodes on the insulating film connected to the first pad terminal such that the second electrodes are uniformly spaced apart from one another in a second direction perpendicular to the first direction.

2. The method according to claim 1, wherein the black matrix includes a thin film of chromium or a carbon-based organic material.

3. The method according to claim 1, wherein the first electrodes and the first and second pad electrodes are simultaneously formed.

4. The method according to claim 1, wherein the step of forming the first electrodes comprises the steps of:

sequentially forming a transparent metal film and a molybdenum film over the overcoat layer;

forming a patterned photoresist mask by coating a photoresist over the molybdenum film, patterning the photoresist using diffraction exposure, and applying a developing processes to the exposed photoresist;

selectively removing the molybdenum film and the transparent metal film using the patterned photoresist as a mask to form the first electrodes spaced apart from one another in the first direction;

ashing the remaining photoresist;

selectively removing the molybdenum film formed on the transparent metal film in each of the first electrodes to expose a portion of the transparent metal film; and removing the photoresist.

5. The method according to claim 4, wherein the step of selectively removing the molybdenum film includes a dry etching process.

6. The method according to claim 1, wherein the phosphor layer is formed using a spin coating method or a printing method.

7. The method according to claim 1, wherein the insulating film is formed using a printing method.

8. The method according to claim 1, wherein the second electrodes are formed using a printing method with a shadow mask.

9. The method according to claim 1, wherein the step of forming second electrodes includes depositing an aluminum film, and selectively removing the aluminum film using a wet etching process with a portion of the aluminum film being masked.

10. The method according to claim 1, wherein each of the color representing layers comprises a color filter layer.

11. The method according to claim 1, wherein each of the color representing layers comprises a color changing medium layer.

12. The method according to claim 1, wherein the phosphor layer comprises a blue phosphor layer.

* * * * *